(12) United States Patent
Kong et al.

(10) Patent No.: US 11,355,458 B2
(45) Date of Patent: Jun. 7, 2022

(54) INTERCONNECT CORE

(71) Applicant: Intel Corporation, Santa Clara, CA (US)

(72) Inventors: Jackson Chung Peng Kong, Tanjung Tokong (MY); Bok Eng Cheah, Bukit Gambir (MY); Ping Ping Ooi, Butterworth (MY); Kooi Chi Ooi, Glugor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/469,073

(22) PCT Filed: Nov. 27, 2017

(86) PCT No.: PCT/US2017/063280
§ 371 (c)(1),
(2) Date: Jun. 12, 2019

(87) PCT Pub. No.: WO2018/125448
PCT Pub. Date: Jul. 5, 2018

(65) Prior Publication Data
US 2019/0295966 A1    Sep. 26, 2019

(30) Foreign Application Priority Data
Dec. 27, 2016   (MY) .......................... PI 2016704806

(51) Int. Cl.
*H01L 23/64* (2006.01)
*H01L 21/48* (2006.01)
(Continued)

(52) U.S. Cl.
CPC .......... *H01L 23/64* (2013.01); *H01L 21/4853* (2013.01); *H01L 21/4857* (2013.01);
(Continued)

(58) Field of Classification Search
CPC ..... H01L 23/64; H01L 23/00; H01L 21/4853; H01L 21/4857; H01L 23/49816;
(Continued)

(56) References Cited

U.S. PATENT DOCUMENTS

| 5,618,189 A | 4/1997 | Jin et al. | |
|---|---|---|---|
| 6,274,821 B1 * | 8/2001 | Echigo | H05K 1/0271 174/255 |

(Continued)

FOREIGN PATENT DOCUMENTS

WO    WO-2018125448 A1    7/2018

OTHER PUBLICATIONS

"International Application Serial No. PCT/US2017/063280, International Search Report dated Mar. 5, 2018", 3 pgs.

(Continued)

*Primary Examiner* — Kyoung Lee
(74) *Attorney, Agent, or Firm* — Schwegman Lundberg & Woessner, P.A.

(57) ABSTRACT

A device and method of utilizing conductive thread interconnect cores. Substrates using conductive thread interconnect cores are shown. Methods of creating a conductive thread interconnect core are shown.

8 Claims, 6 Drawing Sheets

(51) Int. Cl.
*H01L 23/498* (2006.01)
*H01L 23/00* (2006.01)

(52) U.S. Cl.
CPC ........ *H01L 23/00* (2013.01); *H01L 23/49816* (2013.01); *H01L 23/49822* (2013.01); *H01L 23/49838* (2013.01); *H01L 23/49866* (2013.01); *H01L 24/16* (2013.01); H01L 23/49827 (2013.01); H01L 2224/16225 (2013.01); H01L 2924/1432 (2013.01); H01L 2924/1434 (2013.01); H01L 2924/15311 (2013.01); H01L 2924/30111 (2013.01)

(58) Field of Classification Search
CPC ......... H01L 23/49822; H01L 23/49838; H01L 23/49866; H01L 24/16; H01L 23/49827; H01L 2224/16225; H01L 2924/1432; H01L 2924/1434; H01L 2924/15311; H01L 2924/30111
See application file for complete search history.

(56) References Cited

U.S. PATENT DOCUMENTS

| | | | | |
|---|---|---|---|---|
| 8,159,063 | B2* | 4/2012 | Hung | ...................... H01L 23/13 |
| | | | | 257/693 |
| 8,324,740 | B2* | 12/2012 | Hagihara | ................ H01L 24/81 |
| | | | | 257/786 |
| 2002/0020898 | A1* | 2/2002 | Vu | ...................... H01L 23/3114 |
| | | | | 257/676 |
| 2002/0027022 | A1 | 3/2002 | Moriizumi | |
| 2005/0236177 | A1* | 10/2005 | Inagaki | .................... H05K 1/09 |
| | | | | 174/255 |
| 2005/0258548 | A1 | 11/2005 | Ogawa et al. | |
| 2006/0079079 | A1 | 4/2006 | Muthukumar et al. | |
| 2013/0043581 | A1* | 2/2013 | Negoro | ............... H01L 23/3675 |
| | | | | 257/712 |
| 2013/0050972 | A1* | 2/2013 | Mohammed | .......... H01L 21/486 |
| | | | | 361/807 |
| 2016/0064318 | A1* | 3/2016 | Inagaki | ............. H01L 23/49838 |
| | | | | 174/251 |

OTHER PUBLICATIONS

"International Application Serial No. PCT/US2017/063280, Written Opinion dated Mar. 5, 2018", 8 pgs.

"International Application Serial No. PCT US2017 063280, International Preliminary Report on Patentability dated Jul. 11, 2019", 10 pgs.

"Malaysia Application Serial No. PI 2016704806, Substantive Examination Adverse Report dated Feb. 8, 2022", 4 pgs.

* cited by examiner

INTERCONNECT CORE

PRIORITY APPLICATION

This application is a U.S. National Stage Application under 35 U.S.C. 371 from International Application No. PCT/US2017/063280, filed Nov. 27, 2017, published as WO 2018/125448, which claims the benefit of priority to Malaysian Application Serial No. PI 2016704806, filed 27 Dec. 2016, all of which are incorporated herein by reference in their entireties.

TECHNICAL FIELD

Embodiments described herein generally relate to substrates for microelectronic devices.

BACKGROUND

Microelectronic devices such as integrated circuit packages often use a substrate to attach silicon dies to a larger circuit board, often called a motherboard. The substrate helps to support and protect the silicon dies, provide heat dissipation, and signal and power distribution. The substrate provides the interconnections to the motherboard often in the form of a ball grid array.

DESCRIPTION OF EMBODIMENTS

Figure 1:
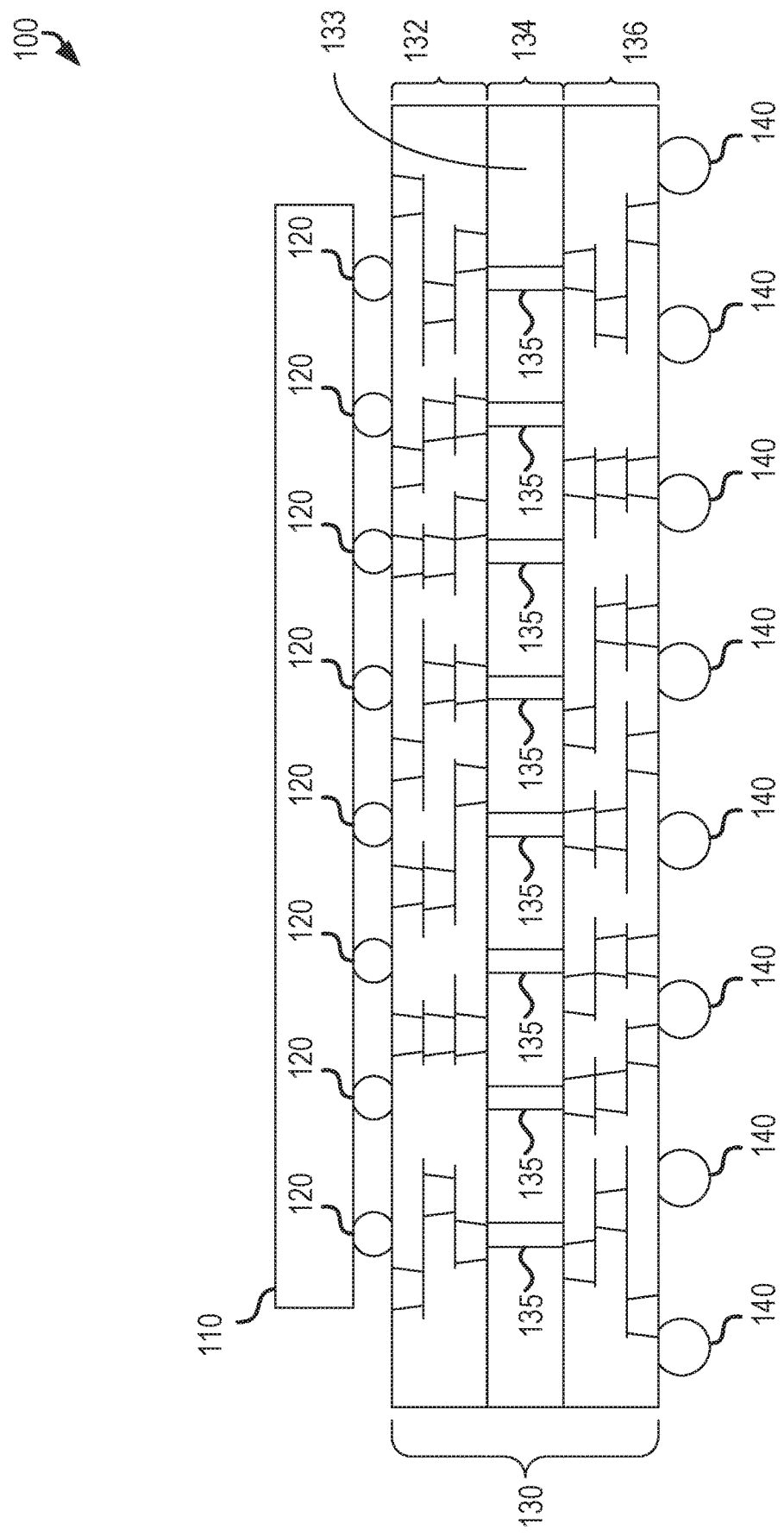
FIG. 1 is a cross-sectional view of an integrated circuit package utilizing a conductive thread interconnect core.

FIG. 1 is a cross-sectional view of an example integrated circuit package 100 utilizing a conductive thread interconnect core 134. The integrated circuit package 100 includes a semiconductor die 110 and a substrate 130. The semiconductor die 110 mounted to the substrate in "flip-chip" orientation with its active side facing downward to couple with an upper surface of the substrate 130. The semiconductor die 110 is attached to the substrate 130 using a set of interconnects 120. The interconnects 120 may be silicon interconnects, solder bumps such as controlled collapse chip connection, conductive epoxy, conductive film such as anisotropic conductive film, or other electrically conductive interconnect. In embodiments where the silicon die is a processor die the integrated circuit package can be termed a processor assembly. In some examples the semiconductor die 110 may be a digital signal processor, a graphics processing unit, a memory, a sensor, a microcontroller, or any other integrated circuit. In some examples, there is a plurality of semiconductor dies attached to the substrate.

The substrate 130 includes a first routing layer 132, a conductive thread interconnect core 134, and a second routing layer 136. The first and second routing layer include metal layers and via interconnects for routing signals from the semiconductor die 110 to the substrate outputs and motherboard interconnects 140. In some examples, the motherboard interconnects 140 are part of a ball grid array. In some examples the ball grid array is a micro-ball grid array. The conductive thread interconnect core 134 adds material and strength to the substrate 130 and ultimately the integrated circuit package 100. The conductive thread interconnect core 134 includes a set of conductive threads 135 in an encapsulant 133. The conductive threads 135 are continuous, smooth, and capless which allows for greater signal integrity. Discontinuities, roughness, or diameter changes, such as caps, can make impedance matching difficult. Poor impedance matching causes signal reflections and signal degradation. Conductive threads can avoid these drawbacks.

Conductive threads can be continuous, smooth, and capless due to how they are formed in the substrate core. In some examples, the set of conductive threads 135 are drawn wire. Drawn wire can include metals, such as copper, aluminum, gold, or other metals. Conductive threads can be identified upon inspection because conductive threads differ greatly from other structures, such as plated through hole vias or stacked micro-vias. Drawn wire will exhibit a smooth surface, and the grains of the metal will show stretching. Vias, and plating methods will exhibit a rough surface. In some examples, the set of conductive threads 135 are arranged and held in place while an encapsulant 133 is flowed around the conductive threads. Upon inspection, the flowed encapsulant will show a flow structure that would not be found in a structure that has been drilled and plated, such as for vias. Conductive threads do not require package core and/or dielectric layer drilling and plating processes that other structures, such as plated through hole vias or micovias, require. Because the drilling and plating of vias are primarily responsible for drawbacks such as discontinuities, rough edges, and the need for caps, conductive threads are not subject to these drawbacks.

Impedance of an interconnect can be calculated using the characteristic impedance equation:

$$Z_0 = \sqrt{\frac{L}{C}}$$

Where $Z_0$ is the interconnect impedance, L is the inductance of the interconnect over a unit of distance, and C is the capacitance of the interconnect over a unit of distance. A continuous interconnect with a smaller diameter has reduced capacitance resulting in a higher overall characteristic impedance to better match the characteristic impedance of traces. Therefore, a conductive thread interconnect will better match the characteristic impedance of traces than other interconnect structures, such as plated through hole vias or stacked micro-vias.

Another benefit of not requiring drilling is the ability for conductive threads to be smaller because they are not restricted by viable drill bit sizes. Conductive threads can be as small as 15 µm in diameter and possibly smaller depending on the material used for the conductive threads. This allows for greater impedance matching with small trace sizes, some of which can be a mere 9 µm in width. Compared to other structures, such as plated through hole vias, which generally measure in the hundreds of micrometers and include large caps at the ends, conductive threads are much better suited for impedance matching.

The small size of conductive threads also allows for increased interconnect density, hence allowing package form-factor miniaturization. The interconnects are smaller allowing them to be placed closer together. An additional benefit of increased interconnect density is a reduction in loop inductance. Loop inductance occurs any time there is a current loop, which occurs any time signals are transmitted in a circuit. Loop inductance can cause crosstalk and signal degradation within a circuit. Loop inductance can be calculated using the following equation:

$$L \approx \mu_0 a \ln\left(\frac{8a}{r_0} - 2\right)$$

L is the loop inductance, $\mu_0$ is a constant, a is the loop radius, and $r_0$ is the interconnect radius. As shown the loop inductance is directly related to the loop radius. Because the interconnects are smaller using conductive threads ground interconnects can be placed closer to power and signal interconnects, thereby reducing the loop radius. While the interconnect radius affects the loop inductance, the effect compared to the loop radius is minimal. Therefore, one skilled in the art will appreciate that smaller interconnects that allow placing interconnects closer together, thereby making the loop radius smaller, will decrease the loop inductance. Decreasing the loop inductance using conductive threads will increase signal integrity.

In some examples, the set of conductive threads 135 are made from a conductive metal with diameters ranging from about 15 µm to about 100 µm. The conductive metal may include copper, gold, silver, aluminum, metal alloys, or any combination thereof. In some examples, the set of conductive threads 135 are made of copper. In some examples, the set of conductive threads 135 are arranged vertically. In some examples, at least some conductive threads, of the set of conductive threads 135 are arranged at an angle offset from vertical. In some examples the encapsulant 133 of the conductive thread interconnect core 134 is a dielectric. The dielectric materials may include polymide, polyamide, bismaleimide-triazineresin, epoxy, polyurethanes, benzocyclobutene, high-density polyethylene, or any combinations thereof. In some examples, the dielectric material is ceramic, or other non-polymeric dielectric. In some examples, the encapsulant 133 includes materials such as inorganic fillers, flame retardants, or adhesion promoters.

Figure 2:
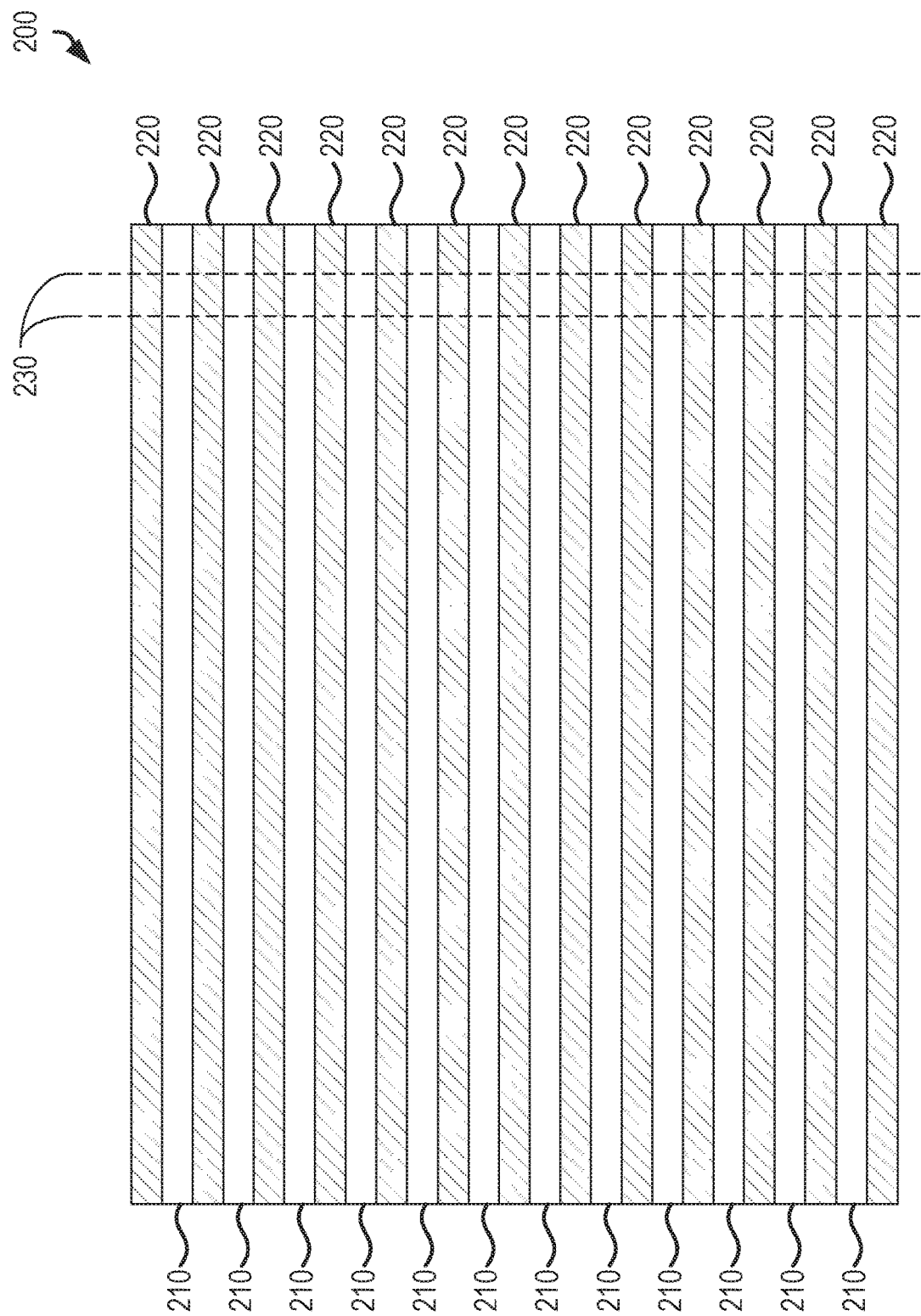
FIG. 2 is a cross-sectional view of an encapsulated block of conductive threads.

FIG. 2 is a cross-sectional view of an example encapsulated block of conductive threads 200 including conductive threads 210 and encapsulant 220. The conductive threads 220 are smooth and capless. The encapsulant 220 holds the conductive threads 210 in the way the conductive threads 210 were arranged prior to encapsulation. In some examples, the conductive threads 210 are arranged symmetrically. In some examples, the conductive threads 210 are arranged asymmetrically. Shown are dotted lines 230 indicating where the encapsulated block of conductive threads can be cut to form a set of conductive thread panels. The thickness of the set of conductive thread panels can be determined based on a needed thickness for a substrate core. In some examples, the thread panels are a predetermined thickness between 100 µm and 500 µm.

In some examples, the set of conductive threads 210 are made from a conductive metal with diameters ranging from about 15 µm to about 100 µm. The conductive metal may include copper, gold, silver, aluminum, metal alloys, or any combination thereof. In some examples, the set of conductive threads 210 is made of copper. In some examples, the set of conductive threads 210 is drawn wire. In some examples, the distance between conductive threads ranges from about 30 µm to about 100 µm. In some examples the encapsulant 220 is a dielectric. The dielectric materials may include polymide, polyamide, bismaleimide-triazineresin, epoxy, polyurethanes, benzocyclobutene, high-densitypolyethylene, or any combinations thereof. In some examples, the encapsulant 220 includes materials such as inorganic fillers, flame retardants, or adhesion promoters. In some examples, the set of conductive threads 210 are arranged vertically. In some examples, at least some conductive threads, of the set of conductive threads 210 are arranged at an angle offset from vertical.

Figure 3:
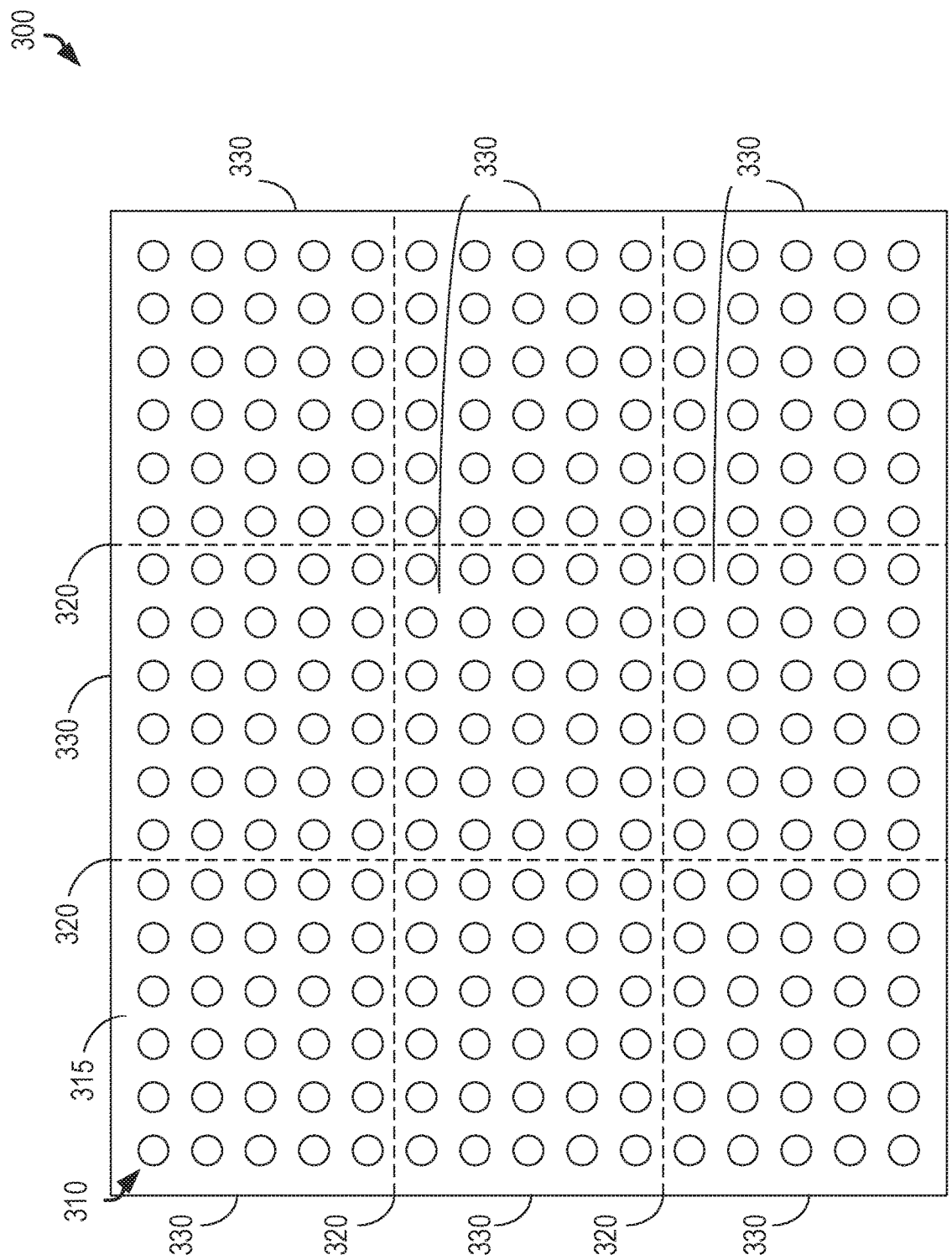
FIG. 3 is an overhead-view of a conductive thread panel.

FIG. 3 is an overhead-view of an example conductive thread panel 300 including conductive threads 310 molded in encapsulant 315. Shown are dotted lines 320 that indicate where the conductive thread panel 300 can be cut to be divided into a set if discrete package substrates or conductive thread interconnect cores 330. Although shown the example shows the conductive thread panel 300 being divided into nine conductive thread interconnect cores, one skilled in the art will appreciate that the conductive thread panel 300 can be designed and divided into more or fewer conductive thread interconnect cores. In some examples, the set of conductive threads 310 are arranged symmetrically. In some examples, the set of conductive threads 310 are arranged asymmetrically.

Figure 4:
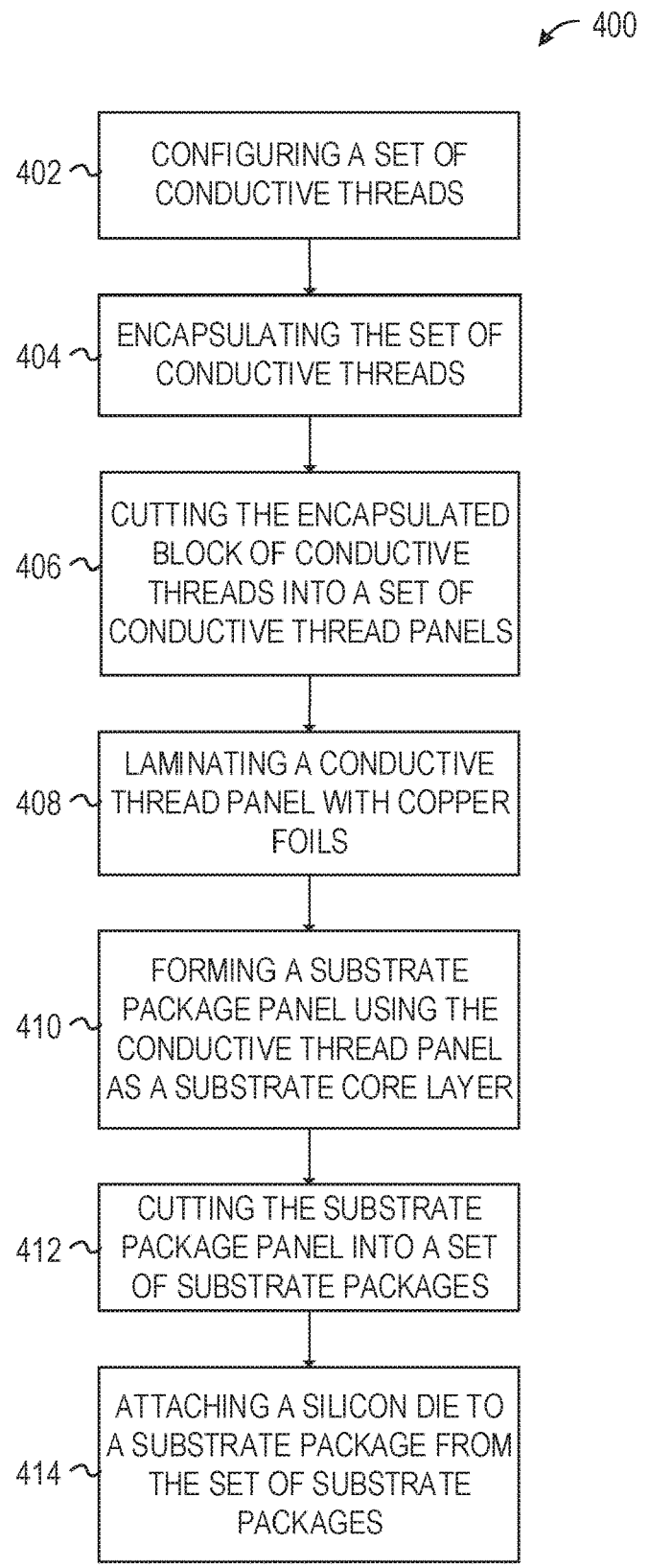
FIG. 4 is a process diagram of a method in accordance with some embodiments of the invention.

FIG. 4 shows steps in an example process 500 of forming a substrate utilizing a conductive thread interconnect core. At FIG. 4 a set of conductive threads is configured 402. The set of conductive threads is held taut such that the conductive threads are straight and do not bend or sag. In an example the set of conductive threads is configured per a preconfigured layout corresponding to the interconnection between a first routing layer, such as first routing layer 132 of FIG. 1, and a second routing layer, such as routing layer 134 of FIG. 1, of a substrate. In an example, the set of conductive threads are encapsulated into an encapsulated block of threads using a molding process 404. In some examples, the molding process is an injection molding process. In some examples the encapsulant 315 is a dielectric. The dielectric materials may include polymide, polyamide, bismaleimide-triazineresin, epoxy, polyurethanes, benzocyclobutene, high-densitypolyethylene, or any combinations thereof. The molding process removes the need to drill and plate via interconnects in substrate cores or other interconnect layers. This decrease manufacturing time and costs because the need to drill and plate individual holes in every interconnect layer is removed.

In an example, the encapsulated block is cut into a set of conductive thread panels 406. In some examples, the encapsulated block is cut using a mechanical sawing process. In some examples, the encapsulated block is cut using a laser cutting process. In some examples, the conductive thread panel thickness can be based upon a predetermined thickness. In some example, the predetermined thickness can be between 100 µm and 500 µm. The predetermined thickness can be based upon a desired material strength of the interconnect layer. In an example, a conductive thread panel of the set of conductive thread panels is laminated with copper foils 408. In an example, the copper foils are laminated on a first side and a second side of the conductive thread panel using a lamination or hot-press process. In an example, the first side of the conductive thread panel is opposite the second side of the conductive thread panel.

In an example, a substrate package panel is formed using the conductive thread panel as a substrate core layer 410. In an example, the formation of the substrate package panel includes photolithography, etching and electroplating processes. In an example, the substrate package panel is cut into a set of substrate packages 412. By creating an encapsulated block and then cutting the block into panels, and eventually singulated packages all the interconnects are arranged and formed at the same time. Cutting can be accomplished through mechanical sawing or a laser cutting process. Compared to drilling and plating thousands of holes individually in other organic substrate panels significant time and cost savings are realized. In an example, a silicon die is attached to a substrate package from the set of substrate packages 414. In an example, the silicon die is attached to the substrate package using a surface mounting or reflow process.

Figure 5:
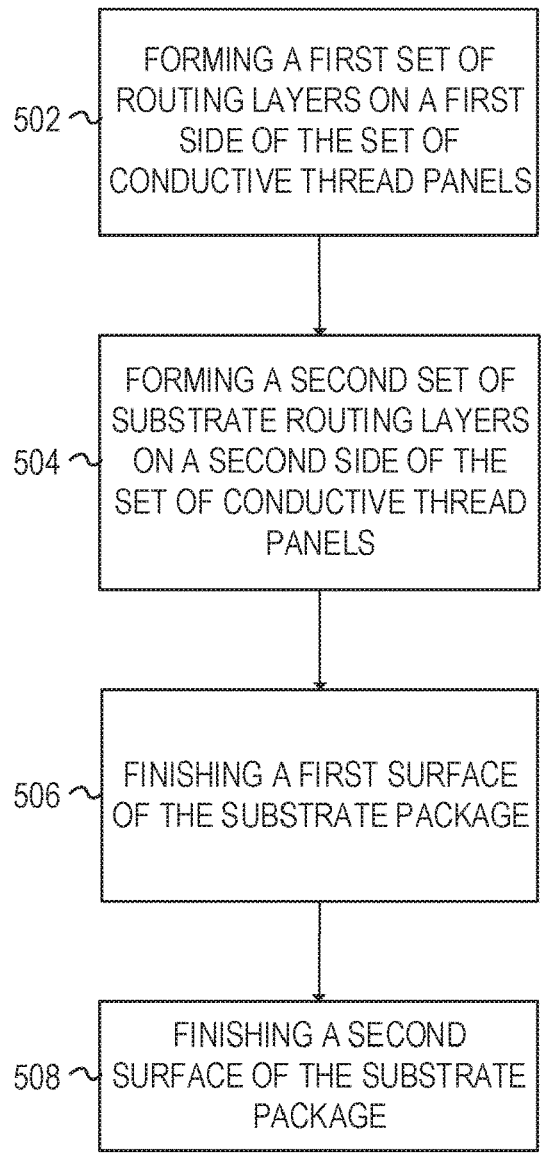
FIG. 5 is a process diagram of a method in accordance with some embodiments of the invention.

FIG. 5 shows steps in an example process 500 of forming a substrate package panel. At FIG. 5 a first set of routing layers is formed on a first side of the set of conductive thread panels via at least one semi-additive process 502. In an example, a second set of routing layers is formed on a second side of the set of conductive thread panels via at least one semi-additive process 504. In an example, process operations 502 and 504 can be performed in parallel. In an example, a first surface of the substrate package is finished via an electroplating and solder resist layer process 506. In an example, a second surface of the substrate package is finished via an electroplating and solder resist layer process 508. In an example, the finished surface layers include a plurality of metal layers. The metal layers can include nickel-palladium-gold layers or nickel-gold layers. In an example, process operations 506 and 508 can be performed in parallel.

Figure 6:
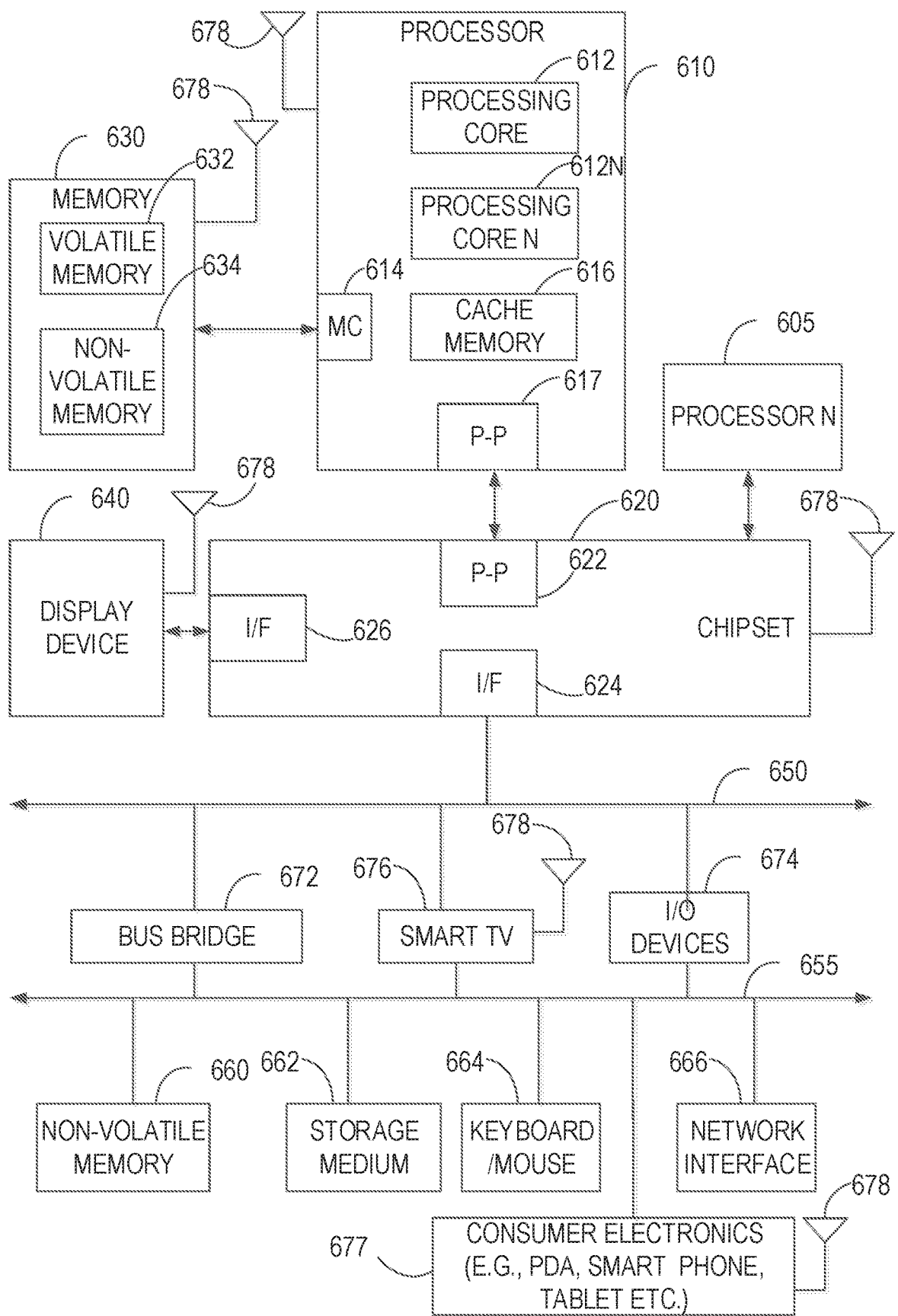
FIG. 6 is a block diagram of an electronic system in accordance with some embodiments of the invention.

FIG. 6 illustrates a system level diagram, according to one embodiment of the invention. For instance, FIG. 6 depicts an example of an electronic device (e.g., system) including the IC package utilizing encapsulated conductive threads as described in the present disclosure. FIG. 6 is included to show an example of a higher level device application for the present invention. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processing cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, the wireless antenna interface 678 operates in accordance with, but is not limited to, the IEEE 602.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to electrically couple to other elements in system 600. In some embodiments of the invention, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices 672, 676, 674, 660, 662, 664, 666, 677, etc. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the invention, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In one embodiment, chipset 620, via interface 624, couples with a non-volatile memory 660, a mass storage device(s) 662, a keyboard/mouse 664, a network interface 666, smart TV 676, consumer electronics 677, etc.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 602.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

To better illustrate the method and apparatuses disclosed herein, a non-limiting list of embodiments is provided here:

Example 1 is a substrate package, comprising: a substrate core layer including: a dielectric; and a set of electrically conductive threads; a first set of substrate routing layers attached to a first side of the substrate core layer; and a second set of substrate routing layers attached to a second side of the substrate core, the second side of the substrate core opposite the first side of the substrate core.

In Example 2, the subject matter of Example 1 optionally includes wherein the electrically conductive threads are arranged asymmetrically within the substrate core layer.

In Example 3, the subject matter of any one or more of Examples 1-2 optionally include wherein an electrically conductive thread of the set of electrically conductive threads has a diameter between fifteen micrometers and one hundred micrometers.

In Example 4, the subject matter of any one or more of Examples 1-3 optionally include wherein the set of electrically conductive threads are copper threads.

In Example 5, the subject matter of any one or more of Examples 1-4 optionally include wherein the set of conductive threads are arranged vertically in the substrate core layer.

In Example 6, the subject matter of any one or more of Examples 1-5 optionally include wherein the dielectric is polyimide.

In Example 7, the subject matter of any one or more of Examples 1-6 optionally include wherein the set of electrically conductive threads are capless interconnects.

Example 8 is a semiconductor device, comprising: a substrate including a substrate core; wherein the substrate core includes: a dielectric; and a set of conductive threads; a first semiconductor die attached to a first side of the substrate; and a ball grid array attached to a second side of the substrate.

In Example 9, the subject matter of Example 8 optionally includes wherein the ball grid array is a micro-ball grid array.

In Example 10, the subject matter of any one or more of Examples 8-9 optionally include wherein the electrically conductive threads are arranged asymmetrically within the substrate core layer.

In Example 11, the subject matter of any one or more of Examples 8-10 optionally include wherein an electrically conductive thread of the set of electrically conductive threads has a diameter between fifteen micrometers and one hundred micrometers.

In Example 12, the subject matter of any one or more of Examples 8-11 optionally include wherein the set of conductive threads are copper threads.

In Example 13, the subject matter of any one or more of Examples 8-12 optionally include wherein the dielectric is polyimide.

In Example 14, the subject matter of any one or more of Examples 8-13 optionally include wherein the set of electrically conductive threads are capless interconnects.

In Example 15, the subject matter of any one or more of Examples 8-14 optionally include a second semiconductor die.

In Example 16, the subject matter of Example 15 optionally includes wherein the first semiconductor die is a central processing unit and the second semiconductor die is a memory die.

Example 17 is a method comprising: configuring a set of conductive threads; encapsulating the set of conductive threads into an encapsulated block of conductive threads using a molding process; and cutting the encapsulated block of conductive threads into a set of conductive thread panels with a predetermined thickness.

In Example 18, the subject matter of Example 17 optionally includes laminating a conductive thread panel of the set of conductive thread panels with copper foils; and forming a substrate package panel using the conductive thread panel as a substrate core layer.

In Example 19, the subject matter of Example 18 optionally includes wherein forming the substrate package panel includes: forming a first set of substrate routing layers on a first side of the set of conductive thread panels via at least one semi-additive process; and forming a second set of substrate routing layers on a second side of the set of conductive thread panels via at least one semi-additive process.

In Example 20, the subject matter of Example 19 optionally includes wherein forming the substrate package panel further includes: finishing a first surface of the substrate package via an electroplating and solder resist layer process; and finishing a second surface of the substrate package via an electroplating and solder resist layer process.

In Example 21, the subject matter of any one or more of Examples 18-20 optionally include cutting the substrate package panel into a set of substrate packages.

In Example 22, the subject matter of Example 21 optionally includes attaching a silicon die to a substrate package from the set of substrate packages via a surface mounting process.

In Example 23, the subject matter of any one or more of Examples 17-22 optionally include wherein the set of conductive threads are copper threads.

In Example 24, the subject matter of any one or more of Examples 17-23 optionally include wherein the set of conductive threads are encapsulated with a dielectric.

In Example 25, the subject matter of Example 24 optionally includes wherein the dielectric is polyimide.

These and other examples and features of the present interconnect core, interconnect core systems, and related methods will be set forth in part in the following detailed description. This overview is intended to provide non-limiting examples of the present subject matter—it is not intended to provide an exclusive or exhaustive explanation. The detailed description below is included to provide further information about the present interconnects, interconnect systems, and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method comprising:
   configuring a set of conductive threads;
   encapsulating the set of conductive threads into an encapsulated block of conductive threads using a molding process; and
   cutting the encapsulated block of conductive threads into a set of conductive thread panels with a predetermined thickness;
   laminating a conductive thread panel of the set of conductive thread panels with copper foils; and
   forming a substrate package panel using the conductive thread panel as a substrate core layer.

2. The method of claim 1, wherein forming the substrate package panel includes:
   forming a first set of substrate routing layers on a first side of the set of conductive thread panels via at least one semi-additive process; and
   forming a second set of substrate routing layers on a second side of the set of conductive thread panels via at least one semi-additive process.

3. The method of claim 2, wherein forming the substrate package panel further includes:
   finishing a first surface of the substrate package via an electroplating and solder resist layer process; and
   finishing a second surface of the substrate package via an electroplating and solder resist layer process.

4. The method of claim 1, further including cutting the substrate package panel into a set of substrate packages.

5. The method of claim 4, further including attaching a silicon die to a substrate package from the set of substrate packages via a surface mounting process.

6. The method of claim 1, wherein the set of conductive threads are copper threads.

7. The method of claim 1, wherein the set of conductive threads are encapsulated with a dielectric.

8. The method of claim 7, wherein the dielectric is polyimide.

* * * * *